United States Patent
Tanaka et al.

[11] Patent Number: 6,028,020
[45] Date of Patent: Feb. 22, 2000

[54] SINGLE CRYSTAL QUARTZ THIN FILM AND PREPARATION THEREOF

[75] Inventors: Motoyuki Tanaka; Takahiro Imai; Naoji Fujimori, all of Itami, Japan

[73] Assignee: Sumitomo Electric Industries, Ltd., Osaka-fu, Japan

[21] Appl. No.: 08/567,530

[22] Filed: Dec. 5, 1995

[30] Foreign Application Priority Data

Dec. 5, 1994 [JP] Japan .................................. 6-300482
Feb. 3, 1995 [JP] Japan .................................. 7-016893

[51] Int. Cl.$^7$ .............................. C03C 10/12; B05D 3/02
[52] U.S. Cl. .............................. 501/7; 501/12; 427/387; 427/503; 427/515; 117/4; 117/90; 117/91; 117/943; 423/335
[58] Field of Search .............................. 423/335; 117/90, 117/91, 4, 943; 427/387, 503, 515; 501/7, 12

[56] References Cited

U.S. PATENT DOCUMENTS

| | | | |
|---|---|---|---|
| 3,514,320 | 5/1970 | Vaugham | 117/943 |
| 3,655,429 | 4/1972 | Deklerk | 428/432 |
| 3,759,683 | 9/1973 | Dislich et al. | 501/7 |
| 4,521,441 | 6/1985 | Flowers | 427/259 |
| 4,596,626 | 6/1986 | Shlichta et al. | 117/90 |
| 4,704,299 | 11/1987 | Wielonski et al. | 427/397.7 |
| 4,849,002 | 7/1989 | Kapp | 501/37 |
| 4,865,829 | 9/1989 | Hattori et al. | 423/335 |
| 5,076,980 | 12/1991 | Nogues et al. | 423/335 |
| 5,100,764 | 3/1992 | Paulson et al. | 428/901 |
| 5,175,027 | 12/1992 | Holmes-Farley et al. | 427/387 |
| 5,200,237 | 4/1993 | Sugama | 427/387 |
| 5,254,508 | 10/1993 | Kirkbir et al. | 501/37 |
| 5,308,802 | 5/1994 | Haun | 501/12 |
| 5,326,720 | 7/1994 | Goda et al. | 423/335 |
| 5,363,799 | 11/1994 | Yonehara et al. | 117/90 |
| 5,373,171 | 12/1994 | Imai et al. | 257/258 |
| 5,593,495 | 1/1997 | Masuda et al. | 117/4 |

*Primary Examiner*—Deborah Jones
*Assistant Examiner*—Cathy F. Lam
*Attorney, Agent, or Firm*—Pillsbury Madison & Sutro LLP

[57] ABSTRACT

A single crystal quartz thin film having a thickness of 5 nm to 50 $\mu$m can be prepared by forming the thin film on a single crystal substrate by a sol-gel process and peeling the thin film from the substrate. The present invention can provide the single crystal quartz thin film at a low price without a large and complex apparatus.

17 Claims, 2 Drawing Sheets

SINGLE CRYSTAL QUARTZ THIN FILM AND PREPARATION THEREOF

BACKGROUND OF THE INVENTION

1. Field of the Invention

The present invention relates to a single crystal quartz thin film and a preparation thereof. The single crystal quartz thin film (or single crystal rock crystal thin film) of the present invention can be used for an oscillator, a vibrator, a surface elastic wave element for a high frequency filter, a light waveguide and the like.

2. Description of Related Art

Quartz (or rock crystal) has a low temperature (<573° C.) phase of silicon dioxide. However, when a quartz-type backbone basically forming a quartz structure has a temperature of at least 870° C., it is unstable. A melting point of silicon dioxide is 1730° C. which is remarkably higher than 870° C. Since a cristobalite-type crystalline structure is stable at a temperature near the melting point, it is impossible to prepare quartz by a simple high temperature treatment.

A conventional method of preparing quartz is only a hydrothermal synthetic method comprising growing a single crystal quartz on a seed crystal from an alkaline solution of silicon dioxide with providing a temperature difference at a high temperature and high pressure. This method of preparing quartz is described in Ceramics Japan, 15 (1980), No. 3, pages 170–175.

According to the above document, a hydrothermal method for preparing quartz comprises charging an aqueous solution (for example, 0.1 to 1 N aqueous NaOH or $Na_2CO_3$ solution) in a large autoclave, positioning a starting material of waste quartz at a lower part of the autoclave and a seed crystal on a convection control panel at an upper part of the autoclave, and heating the closed autoclave by an external heater. At this time, by maintaining the temperature of the upper part of the autoclave at 330–340° C. and the temperature of the lower part of the autoclave at 360–370° C. to give a constant temperature difference and maintaining an internal pressure of the autoclave at a high pressure of 800 to 1,500 $kg/cm^2$, the starting material of waste quartz is molten and transported to the upper part by the convection, the waste quartz is supersaturated in the upper part having lower temperature than the lower part so that quartz is deposited and grows on the seed crystal.

The hydrothermal synthesis can give only a large bulk crystal or particulate powder. Presently, when a thin film is necessary for an oscillator, a vibrator, and a surface elastic wave element for a high frequency filter, the large single crystal prepared by the hydrothermal synthesis is cut to give the thin film.

However, with the higher frequency of the recent telecommunication, it is necessary to obtain a thinner quartz. For example, Japanese Patent Kokai Publication No. 327383/1993 proposes that quartz is adhered to a semiconductor substrate, polished and processed to give a thin film. However, the preparation of thin film by the processing has the limitation of the thickness of the processed thin film and has a high cost.

The conventional method of preparing quartz by the hydrothermal procedure needs a large-scale apparatus to use the high pressure, for example, an autoclave and can give a lower cost only by the growth of a large single crystal by a huge apparatus. Since this procedure cannot easily give a arbitrary shape of quartz single crystal, the large single crystal is processed to give quartz having the desired shape.

Particularly, an oscillator, a vibrator and a surface elastic wave element which are a main use of quartz require a thinner quartz with the higher frequency of the telecommunication. However, the conventional method of forming a quartz thin film by the cutting of the large single crystal can practically give the thickness of at least 50 $\mu$m and cannot satisfy the requirement of thinner film.

SUMMARY OF THE INVENTION

One object of the present invention is to provide a single crystal quartz thin film satisfying a recent requirement of thinner thickness.

Another object of the present invention is to provide a method of economically preparing a single crystal quartz thin film without a large-scale apparatus such as in a hydrothermal procedure.

The present invention provides a single crystal quartz thin film comprising silicon dioxide and having a thickness of 5 nm to 50 $\mu$m which is prepared by forming the thin film on a single crystal substrate by a sol-gel process and peeling the thin film from the substrate.

The present invention provides a quartz oscillator comprising an oscillating part of a single crystal quartz thin film comprising silicon dioxide and having a thickness of 5 nm to 50 $\mu$m which is prepared by forming the thin film on a single crystal substrate by a sol-gel process and peeling the thin film from the substrate.

The present invention provides a method of preparing a single crystal quartz thin film comprising steps of forming an oxide single crystal film having a quartz-type crystalline structure comprising germanium dioxide on a single crystal substrate by a sol-gel process, forming a single crystal quartz thin film comprising silicon dioxide on the oxide single crystal film by a sol-gel process, and then peeling the single crystal quartz thin film from the single crystal substrate by dissolving the oxide single crystal film in an aqueous solution.

The present invention provides a method of preparing a quartz oscillator comprising steps of forming an oxide single crystal film having a quartz-type crystalline structure comprising germanium dioxide on a single crystal substrate by a sol-gel process, forming an single crystal quartz thin film comprising silicon dioxide on the oxide single crystal film by a sol-gel process, peeling the single crystal quartz thin film from the single crystal substrate by dissolving the oxide single crystal film in an aqueous solution, and incorporating the single crystal quartz thin film as an oscillating part.

DETAILED DESCRIPTION OF THE INVENTION

Figure 1:
FIG. 1 is a cross-sectional view of a single crystal substrate used for the preparation of a quartz oscillator of the present invention.

In the present invention, quartz (or rock crystal) of the single crystal quartz thin film means an oxide having quartz-type crystalline structure in which a total amount of silicon (Si) and germanium (Ge) is at least 70% by mole, preferably at least 90% by mole of a total amount of all metal elements.

The preparation of the single crystal quartz thin film by the sol-gel process is conducted as follows. A single crystal used as the substrate is provided. The single crystal is a single crystal material such as quartz or germanium dioxide having a quartz-type crystalline structure on which a single crystal easily grows. The single crystal is most preferably quartz. The single crystal may be an oxide single crystal such as sapphire, MgO, $SrTiO_3$, $LiNbO_3$ and $LiTaO_3$.

A solvent such as an alcohol is added to a germanium compound soluble in the solvent such as an alkoxide of germanium; Li, water or an amine is optionally added to the resultant metal-containing solution and/or the resultant metal-containing solution is heated at the reflux to give a precursor solution for the sol-gel process. The precursor solution is coated on the single crystal substrate such as quartz or sapphire by a spin coating, a dip coating or the like.

The substrate having the precursor solution coating is heated to an elevated temperature to evaporate the solvent and the like and conduct the gelation and then the solidification and the crystallization. Accordingly, the oxide single crystal film of germanium dioxide can be synthesized at a low temperature. Since the coating is conducted at a solution state, a shapability is high so that the thin film can be easily prepared.

The thickness of the oxide single crystal film of germanium dioxide can be controlled by the coating conditions such as a viscosity of the precursor solution, the number of revolutions of the substrate, a pulling rate and the like. The procedure from the coating to the crystallization may be repeated until the desired thickness is obtained.

Using a silicon compound such as an alkoxide of silicon in the same manner as in the case of germanium dioxide, a precursor solution for the sol-gel process is prepared, coated on the oxide single crystal film of germanium dioxide and crystallized to give a single crystal quartz thin film. In order to control the thickness of the single crystal quartz thin film, the coating conditions are controlled and the procedure from the coating to the crystallization is repeated for a necessary number of times.

The oxide single crystal film of germanium dioxide is dissolved in an aqueous solution to remove the single crystal quartz thin film from the substrate. The aqueous solution may be pure water. The aqueous solution is preferably a hydrochloric acid, aqua regia, a solution of sodium hydroxide or potassium hydroxide having a suitable concentration. If necessary, after a support plate is adhered to the single crystal quartz thin film, the oxide single crystal film is dissolved. The suitable support plate may be a normal and smooth Si wafer and glass plate. The support plate can be firmly adhered to the single crystal quartz thin film layer by thermally pressing the support plate to the single crystal quartz thin film layer. Alternatively, after the precursor solution for sol-gel procedure is coated on the oxide single crystal film, the support plate can be adhered to the oxide single crystal film by heating the precursor solution in the state that the support plate is piled on the oxide single crystal film. The preparation of the single crystal quartz thin film can be conducted simultaneously with the adhesion of support plate to the single crystal quartz thin film. The formation of a support part may be conducted after a next peeling step. However, in order to make easy the handling of the single crystal quartz thin film in each step, the support part is preferably formed before the peeling step.

A portion of the support plate supporting a whole surface of the single crystal quartz thin film is etched to form the oscillating part of the single crystal quartz thin film. Alternatively, when the support plate having the structure in which a portion of the single crystal quartz thin film does not adhere to the support plate is used, the etching process of the support plate after the peeling can be omitted.

The single crystal quartz thin film is etched by a acidic solution such as an acidic aqueous solution of ammonium fluoride to adjust the shape of the oscillating part of the quartz oscillator. The electrodes are formed by a vapor phase deposition on the both surfaces of the resulting oscillating part comprising the single crystal quartz thin film to give the quartz oscillator.

By the sol-gel process, the crystal solid comprising germanium dioxide or silicon dioxide as the main component can be prepared at a low temperature.

The thickness of each of the single crystal quartz thin film and the oxide single crystal film of germanium dioxide is at least 5 nm in order to give the film having the uniform and stable properties in view of the smoothness of the coated surface. The thickness can be controlled by controlling the coating conditions and by repeating the coating and drying process. The thickness of each of the single crystal quartz thin film and the oxide single crystal film of germanium dioxide is at most 50 $\mu$m, since the stable properties can be obtained. If it is larger than 50 $\mu$m, the accumulation of a defect, a thermal stress and a surface roughness caused by the repeating of the process gives a poor crystallinity.

After the coated precursor solution is dried to give a precursor layer, the precursor layer is thermally treated at the temperature of 500 to 1,200° C. so that the layer crystallizes and epitaxially grows on the single crystal substrate to give the single crystal quartz thin film or the oxide single crystal film having the quartz-type structure. If the temperature is lower than 500° C., no crystallization occurs. If the temperature is higher than 1,200° C., the thin film has a crystalline structure having a different type of high temperature phase. The temperature for the thermal treatment is from 800 to 1,000° C. The thermal treatment is preferably conducted in an oxygen atmosphere optionally containing a steam or in an atmospheric environment optionally containing a steam.

Specific examples of the metal compound used as the starting material for the sol-gel process are a metal alkoxide such as $Si(OCH_3)_4$, $Si(OC_2H_5)_4$, $Si(OC_3H_7)_4$, $Ge(OCH_3)_4$, $Ge(OC_2H_5)_4$, and $Ge(OC_3H_7)_4$; a metal acetylacetate such as $Si(COCH_2COCH_3)_4$; and a metal chloride such as $SiCl_4$.

Since a piezoelectric property and an optical property of the oxide single crystal having the quartz-type crystalline structure are dependent on said crystal structure, the prepared single crystal should have excellent crystallinity by aligning all axes of the crystal so as to exhibit sufficiently these properties. When the single crystal substrate is used as the substrate and the epitaxial growth which gives an influence of the crystalline structure of the substrate on the crystalline structure of the thin film through the bond of interface between the substrate and the thin film is utilized, the single crystal thin film having excellent crystallinity can be obtained.

According to the present invention, the use of the single crystal substrate as the substrate can give the single crystal thin film having the excellent crystallinity having all axes aligned in the same direction, namely, the single crystal thin film having excellent properties. The single crystal substrate is preferably an oxide single crystal, for example, quartz, sapphire, magnesium oxide and the like. Among them, quartz is most preferable, since quartz has almost the same crystalline structure and lattice constant as the grown thin film. A crystal direction of the substrate surface is not limited.

Because the oxide single crystal having the quartz-type crystalline structure is in the low temperature, a mere thermal treatment cannot give the crystallization. Even if the crystallization is conducted, the oxide crystal may have a different type of a high temperature phase crystalline structure. The addition of an alkaline metal such as Li, Na, K and the like has the effect expanding a temperature range in which the quartz-type crystalline structure is stably present. The small amount addition of the alkaline metal to the metal-containing solution can easily give the oxide single crystal having the quartz-type crystalline structure.

However, since the incorporation of the alkaline metal may deteriorate the properties of the oxide single crystal having the quartz-type crystalline structure, the addition amount of the alkaline metal is preferably a very small amount. In the present invention, the addition amount of the alkaline metal is preferably $3 \times 10^{-4}\%$ by mole to 5% by mole based on a total amount of metal elements contained in the metal-containing solution.

Inter alia, Li is most preferable, since Li can expand the temperature range in which the quartz-type crystalline structure can be present at a very small amount of Li. Since Li has the most smallest atomic radius among the alkaline metals, Li has a low effect on the properties of quartz in comparison with other elements. In the case of Li, an electrolysis diffusion treatment, after the preparation of the single crystal, comprising applying a high electric field to diffuse and remove metal ions can be effectively conducted in comparison with other elements. Therefore, most preferable alkaline metal is Li. The addition amount of Li is preferably from $3 \times 10^{-4}\%$ by mole to 5% by mole based on a total amount of metal elements contained in the metal containing solution. If the amount is smaller than $3 \times 10^{-4}\%$ by mole, the effect expanding the temperature range in which the quartz-type crystalline structure can be stably present is weak. If the amount is larger than 5% by mole, the properties of quartz are significantly deteriorated. The amount of Li may be, for example, 0.03 to 3% by mole.

Since germanium dioxide having the quartz-type crystalline structure is stable up to 1033° C., no addition of the alkaline metal can stably give germanium dioxide having the quartz-type crystalline structure by the sol-gel process. However, the alkaline metal addition has a remarkable effect on the formation of single crystal quartz thin film comprising silicon dioxide as the main component. When the alkaline metal is added, the silicon content in the metal-containing solution is preferably at least 50% by mole, more preferably at least 90% by mole based on the total amount of the metal elements in the metal-containing solution.

Since germanium can stably give the quartz-type crystalline structure by the sol-gel process, the addition of the germanium dioxide to the silicon-containing solution can easily give quartz even if no alkaline metal is added. In this case, it is preferable that a total of silicon and germanium is at least 70% based on the total amount of metals and a molar ratio of germanium to silicon is from 0.01 to 4. If the molar ratio of Ge/Si is smaller than 0.01, the effect stabilizing the quartz-type crystalline structure is small. If the ratio is larger than 4, germanium dioxide has a significant instability. The molar ratio of Ge/Si is more preferably from 0.2 to 1.5.

In order to synthesize the solid by the sol-gel process, it is necessary to control the gelation step of the solution. The insufficient gelation may give the evaporation of the raw material during the thermal treatment. The excess gelation gives the gathering of the large gelled materials and a difference of crystallinity or a gap is caused between the gel materials so that it is difficult to form a dense and good crystalline film.

The process for controlling the gelation process includes a process of adding various additives to the precursor solution. The addition of water can give the hydrolysis of the metal compound in the precursor solution to form a metal hydroxide having a high activity so that the gelation is promoted by the polycondensation between the metal hydroxides. The addition amount of water is dependent on the added other additives and is preferably from 0.2 to 20 molar equivalent based on all metal elements contained in the metal-containing solution in order to give a suitable gelation. When the amount is smaller than 0.2 molar equivalent, the promotion of gelation is weak so that it is difficult to give the dense film due to the evaporation of the raw material during the thermal treatment. When the amount is larger than 20 molar equivalent, the gelation excessively proceeds so that it is difficult to give a uniform coating.

The addition of an organic additive having a hydroxyl group such as diethanol amine, (diisopropanol amine, triethanol amine and diethylene glycol decreases the activity of the metal compound by a replacement reaction with the metal compound so as to stabilize the precursor solution. The addition of the organic additive having hydroxyl group can control the excess proceeding of the gelation so as to prevent a change of the precursor solution with time. The addition amount of the organic additive having hydroxyl group depends on the combination with other additives and is preferably at most 6 molar equivalent based on all metal elements contained in the metal-containing solution. The amount of larger than 6 molar equivalent has no significant difference from the case of the amount of at most 6 molar equivalent and gives the incorporation of impurity such as carbon.

The additives such as alkaline metal, water and the organic additive having hydroxyl group can be used in combination. The combination of the additives can increase the advantageous effect of the additives.

When the quartz oscillator is prepared by the method of the present invention, the control of the film thickness is easy and the quartz oscillator having an arbitrary shape can be prepared at a low price according to the shape of the single crystal substrate.

The present invention will be illustrated by the attached drawings.

FIG. 1 is a cross-sectional view of a single crystal substrate used for the preparation of a quartz oscillator of the present invention. The substrate 1 is shown.

Figure 2:
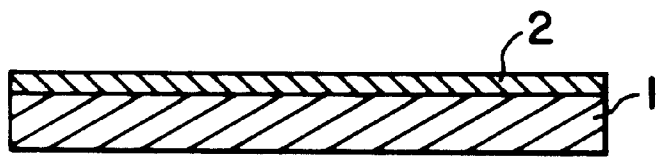
FIG. 2 is a cross-sectional view of an oxide single crystal film comprising $GeO_2$ as the main component formed on a single crystal substrate according to a preparation method of Example 1.

FIG. 2 is a cross-sectional view of an oxide single crystal film comprising $GeO_2$ as the main component formed on a single crystal substrate according to a preparation method of Example 1. The oxide single crystal film 2 is positioned on the single crystal substrate 1.

Figure 3:
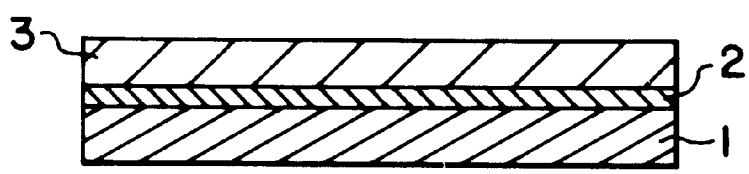
FIG. 3 is a cross-sectional view of a single crystal quartz thin film formed on an oxide single crystal film according to a preparation method of Example 1.

FIG. 3 is a cross-sectional view of a single crystal quartz thin film formed on an oxide single crystal film according to a preparation method of Example 1. The single crystal quartz thin film 3 is positioned on the oxide single crystal film 2. The oxide single crystal film 2 is positioned on the single crystal substrate 1.

Figure 4:
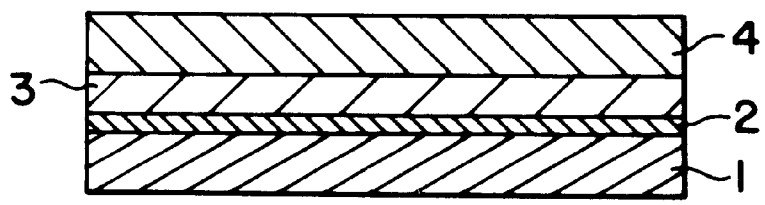
FIG. 4 is a cross-sectional view of a support plate adhered to a single crystal quartz thin film according to a preparation method of Example 1.

FIG. 4 is a cross-sectional view of a support plate adhered to a single crystal quartz thin film according to a preparation method of Example 1. The support plate 4 is positioned on the single crystal quartz thin film 3. The single crystal quartz thin film 3 is positioned on an oxide single crystal film 2. The oxide single crystal film 2 is positioned on the single crystal substrate 1.

Figure 5:
FIG. 5 is a cross-sectional view of a single crystal quartz thin film peeled from a single crystal substrate according to a preparation method of Example 1.

FIG. 5 is a cross-sectional view of a single crystal quartz thin film peeled from a single crystal substrate according to a preparation method of Example 1. The oxide single crystal film 2 shown in FIG. 4 is removed to give the laminate of the single crystal quartz thin film 3 and the support plate 4.

Figure 6:
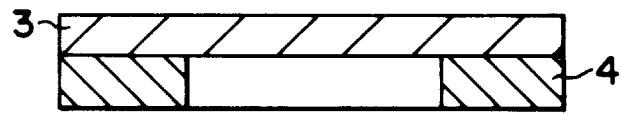
FIG. 6 is a cross-sectional view of a single crystal quartz thin film in which a portion of a support plate adhered to the single crystal quartz thin film is removed according to a preparation method of Example 1.

FIG. 6 is a cross-sectional view of a single crystal quartz thin film in which a portion of a support plate adhered to the single crystal quartz thin film is removed according to a preparation method of Example 1. A portion of the support plate 4 is removed from the laminate of the single crystal quartz thin film 3 and the support plate 4 shown in FIG. 5.

Figure 7:
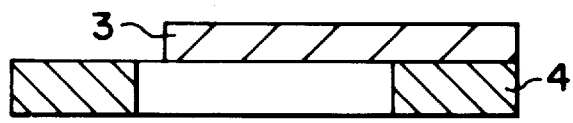
FIG. 7 is a cross-sectional view of an oscillating part prepared by removing a portion of a single crystal quartz thin film according to a preparation method of Example 1.

FIG. 7 is a cross-sectional view of an oscillating part prepared by removing a portion of a single crystal quartz thin film according to a preparation method of Example 1. A portion of the single crystal quartz thin film is removed from the laminate of the single crystal quartz thin film 3 and the support plate 4 shown in FIG. 6.

Figure 8:
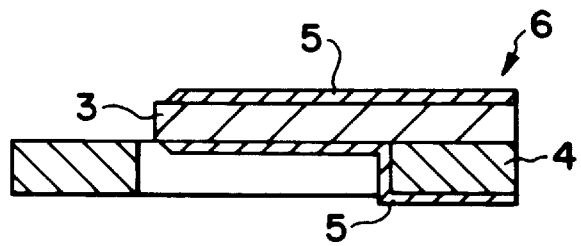
FIG. 8 is a cross-sectional view of a quartz oscillator prepared by forming electrodes on an oscillating part according to a preparation method of Example 1.

FIG. 8 is a cross-sectional view of a quartz oscillator prepared by forming electrodes on an oscillating part according to a preparation method of Example 1. The electrode 5 is positioned on the surfaces of a part of the single crystal quartz thin film 3 and the support plate 4 shown FIG. 7 to give the quartz oscillator 6.

Figure 9:
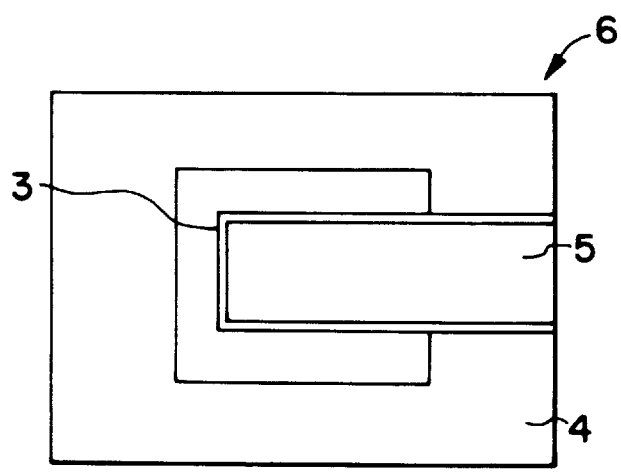
FIG. 9 is a plane view of a quartz oscillator shown in FIG. 8.

FIG. 9 is a plane view of a quartz oscillator shown in FIG. 8.

Preferred Embodiment of the Invention

The present invention will be illustrated by the following Examples which do not limit the present invention.

EXAMPLE 1

The oscillator of the present invention was prepared according to a sol-gel process using a metal alkoxide as a raw material. An AT plane of quartz (2 mm×3 mm) which was mirror-polished was used as the single crystal substrate 1 shown in FIG. 1. The plane was pretreated, namely ultrasonically cleaned in acetone, dipped in a 20 wt % hydrochloric acid, washed in pure water and dried.

$Ge(OC_2H_5)_4$ was dissolved in ethanol (100 ml) to prepare a solution in ethanol having a Ge concentration of about 0.5 mole/L and then water (2.7 g) was added to give a precursor solution. After the precursor solution was coated on the single crystal substrate 1 by a spin coating at 2,000 rpm, it was dried at 200° C. The process including the spin coating and the drying was repeated ten times. The substrate was heated up to 800° C. at a temperature increase rate of 10° C./min in an oxygen atmosphere. The temperature of 800° C. was kept for two hours to give an oxide single crystal film 2 comprising $GeO_2$ as a main component, having a quartz-type crystalline structure and positioned on the single crystal substrate 1 as shown in FIG. 2.

$Si(OC_2H_5)_4$ was dissolved in ethanol (100 ml) to prepare a solution in ethanol having a Si concentration of about 0.5 mole/L and then water (2.7 g), diethanol amine (5.257 g) and $LiOC_2H_5$ (0.026 g (1% by mole based on Si)) were added to give a precursor solution for a single crystal quartz thin film. After the precursor solution was coated on the oxide single crystal film 2 by a spin coating at 2,000 rpm, it was dried at 200° C. The process including the spin coating and the drying was repeated sixty times. The substrate was heated up to 850° C. at a temperature increase rate of 10° C./min in an oxygen atmosphere. The temperature of 850° C. was kept for two hours to give a single crystal quartz thin film 3 as shown FIG. 3.

A support plate 4 of a mirror-polished single crystal Si wafer (2 mm×3 mm) was piled on the single crystal quartz thin film 3, and then a load was applied and the support plate 4 and the thin film 3 were heated at 500° C. for 10 minutes to adhere the support plate 4 to the thin film 3 as shown in FIG. 4. The sample having the adhered support plate 4 was treated in 20 wt % aqueous solution of hydrochloric acid for 3 hours so that the oxide single crystal film comprising $GeO_2$ as the main component was dissolved to peel the single crystal quartz thin film 3 from the single crystal substrate 1 as shown in FIG. 5. The resultant single crystal quartz thin film 3 was evaluated by a X-ray diffraction to reveal the production of an AT plane of the single crystal quartz thin film having excellent crystallinity and the thickness of 9.8 μm.

The support plate 4 was etched by an aqueous solution of potassium hydroxide so as to expose a center portion (1 mm×1.5 mm) of the single crystal quartz thin film 3 as shown in FIG. 6. A portion of the single crystal quartz thin film 3 was etched by an acidic aqueous solution of ammonium fluoride to give an oscillating part having a size of 1 mm×0.5 mm as shown in FIG. 7. Silver was positioned by a vapor phase deposition on the both surfaces of the support plate 4 to give electrodes 5 as shown in FIGS. 8 and 9. The quartz oscillator prepared by the above manner had a basic frequency of 172 MHz.

EXAMPLE 2

The same procedure as in Example 1 was repeated to give a single crystal quartz thin film. A precursor solution for preparing quartz was coated once on the resultant single crystal quartz thin film. A support plate (2 mm×3 mm) of quartz glass having a hole (1 mm×1 mm) at which the support plate did not contact with a center part of the single crystal quartz thin film was piled on the single crystal quartz thin film. After the single crystal quartz thin film was dried at 200° C., the single crystal quartz thin film was heated up to 950° C. at the temperature increase rate of 10° C./min and the temperature of 950° C. was kept for 2 hours to give the formation of single crystal quartz thin film caused by the solidification of the precursor solution simultaneously with the adhesion of the single crystal quartz thin film to the support plate.

The sample having the adhesion to the support plate was treated with a boiling 5 M aqueous solution of sodium hydroxide for 2 hours. The oxide single crystal thin film comprising $GeO_2$ as the main component was dissolved so that the single crystal quartz thin film was peeled from the single crystal substrate. The resultant single crystal quartz thin film was evaluated by a X-ray diffraction to reveal the production of an AT plane of the single crystal quartz thin film having excellent crystallinity and the thickness of 10 μm.

A portion of the single crystal quartz thin film was etched by an acidic aqueous solution of ammonium fluoride to give an oscillating part having a size of 1 mm×0.5 mm. Silver was positioned by a vapor phase deposition on the both surfaces of the support plate to give electrodes. The quartz oscillator prepared by the above manner had a basic frequency of 172 MHz.

EXAMPLE 3

The same procedure as in Example 1 was repeated to give an oxide single crystal film comprising $GeO_2$ as the main component. $Si(OCH_3)_4$ and $Ge(OC_2H_5)_4$ were dissolved in ethanol (100 mL) to give an ethanol solution having a molar ratio of germanium to silicon of 1 and a concentration of germanium and silicon of 0.5 mole/L and water (2.7 g) was added to give a precursor solution for preparing a single crystal quartz thin film.

After the precursor solution was coated on the oxide single crystal film by a spin coating at 2,000 rpm, it was dried. The process including the spin coating and the drying was repeated sixty times. A support plate (2 mm×3 mm) of quartz glass having a hole (1 mm×1 mm) at which the support plate did not contact with a center part of the single crystal quartz thin film was piled on the single crystal quartz thin film. After the single crystal quartz thin film was dried at 200° C., the single crystal quartz thin film was heated up to 950° C. at the temperature increase rate of 10° C./min and the temperature of 950° C. was kept for 2 hours to give the formation of single crystal quartz thin film caused by the solidification of the precursor solution simultaneously with the adhesion of the single crystal quartz thin film to the support plate.

The sample having the adhesion to the support plate was treated with a boiling 5 M aqueous solution of sodium hydroxide for 2 hours. The oxide single crystal thin film comprising $GeO_2$ as the main component was dissolved so that the single crystal quartz thin film was peeled from the single crystal substrate. The resultant single crystal quartz thin film was evaluated by a X-ray diffraction to reveal the production of an AT plane of the single crystal quartz thin film having excellent crystallinity and the thickness of 11 μm.

A portion of the single crystal quartz thin film was etched by an acidic aqueous solution of ammonium fluoride to give an oscillating part having a size of 1 mm×0.5 mm. Silver was positioned by a vapor phase deposition on the both surfaces of the support plate to give electrodes. The quartz oscillator prepared by the above manner had a basic frequency of 154 MHz.

EXAMPLE 4

A single crystal quartz thin film of the present invention was prepared according to a sol-gel process using a metal alkoxide as a raw material. The Y plane of quartz (20 mm×20 mm) which was mirror-polished was used as the single crystal substrate 1 shown in FIG. 1. The plane was pretreated, namely ultrasonically cleaned in acetone, dipped in a 20 wt % hydrochloric acid, washed in pure water and dried.

$Ge(OC_2H_5)_4$ was dissolved in ethanol (100 ml) to prepare a solution in ethanol having a Ge concentration of about 0.5 mole/L and then water (2.7 g) was added to give a precursor solution. After the precursor solution was coated on the single crystal substrate 1 by a spin coating at 2,000 rpm, it was dried at 200° C. The process including the spin coating and the drying was repeated ten times. The substrate was heated up to 800° C. at a temperature increase rate of 10° C./min in an oxygen atmosphere. The temperature of 800° C. was kept for two hours to give an oxide single crystal film 2 comprising $GeO_2$ as a main component, having a quartz-type crystalline structure and positioned on the single crystal substrate 1 as shown in FIG. 2.

$Si(OC_2H_5)_4$ was dissolved in ethanol (100 ml) to prepare a solution in ethanol having a Si concentration of about 0.5 mole/L and then water (2.7 g), diethanol amine (5.257 g) and $LiOC_2H_5$ (0.026 g (1% by mole based on Si)) were added to give a precursor solution for a single crystal quartz thin film. After the precursor solution was coated on the oxide single crystal film 2 by a spin coating at 2,000 rpm, it was dried at 200° C. The process including the spin coating and the drying was repeated twenty times. The substrate was heated up to 850° C. at a temperature increase rate of 10° C./min in an oxygen atmosphere. The temperature of 850° C. was kept for two hours to give a single crystal quartz thin film 3 as shown FIG. 3.

A support plate 4 of a mirror-polished single crystal Si wafer (diameter 50 mm) was piled on the single crystal quartz thin film 3, and then a load was applied and the support plate 4 and the thin film 3 were heated at 500° C. for 10 minutes to adhere the support plate 4 to the thin film 3 as shown in FIG. 4. The sample having the adhered support plate 4 was treated in 20 wt % aqueous solution of hydrochloric acid for 3 hours so that the oxide single crystal film comprising $GeO_2$ as the main component was dissolved to peel the single crystal quartz thin film 3 from the single crystal substrate 1 as shown in FIG. 5. The resultant single crystal quartz thin film 3 was evaluated by a X-ray diffraction to reveal the production of the Y plane of the single crystal quartz thin film having excellent crystallinity and the thickness of 1.8 μm.

Effect of the Invention

The present invention can economically provide a quartz oscillator comprising an oscillating part having the arbitrary thickness of 5 nm to 50 μm and desired shape, which oscillator can satisfy the requirement of thinner thickness caused by a higher frequency, by the use of sol-gel process utilizing no large and complex apparatus.

What is claimed is:

1. A single crystal quartz thin film comprising silicon dioxide and having a thickness of 5 nm to 50 μm, wherein the single crystal quartz thin film is prepared by a process comprising:

forming the single crystal quartz thin film on a single crystal substrate by a sol-gel process, and peeling said single crystal quartz thin film from the single crystal substrate, wherein, said single crystal quartz thin film comprises $3 \times 10^{-4}$ % by mole to 5% by mole of lithium based on a total amount of metal elements in a metal-containing precursor solution for the sol-gel process.

2. A single crystal quartz thin film according to claim 1, wherein the single crystal quartz thin film is separate and distinct from the substrate upon which the single crystal quartz thin film was grown.

3. A single crystal quartz thin film according to claim 1, wherein the single crystal quartz thin film is prepared by a process comprising:

(i) forming a germanium dioxide single crystal film having a quartz crystalline structure on a single crystal substrate by a sol-gel process;

(ii) forming the single crystal quartz thin film on the germanium dioxide single crystal film by a sol-gel process; and (iii) peeling the single crystal quartz thin film from the single crystal substrate by dissolving the germanium dioxide single crystal film.

4. A single crystal quartz thin film according to claim 3, wherein the germanium dioxide single crystal film is dissolved in an aqueous solution.

5. A single crystal quartz thin film according to claim 3, wherein the process of preparing the thin film further comprises adhering the single crystal quartz thin film to a support plate.

6. A single crystal quartz thin film according to claim 1, wherein the single crystal substrate comprises at least one member selected from the group consisting of sapphire, MgO, $SrTiO_3$, $LiNbO_3$, and $LiTaO_3$.

7. A single crystal quartz thin film according to claim 1, wherein a metal-containing precursor solution for the sol-gel process comprises silicon and germanium.

8. A single crystal quartz thin film according to claim 7, wherein a molar ratio of germanium to silicon is in the range of 0.01 to 4.0.

9. A single crystal quartz thin film according to claim 8, wherein the molar ratio of germanium to silicon is in the range of 0.2 to 1.5.

10. A single crystal quartz thin film according to claim 1, wherein the metal-containing precursor solution for the sol-gel process comprises 0.2 to 20.0 molar equivalent of water based on a total amount of metal elements in the precursor solution.

11. A single crystal quartz thin film according to claim 1, wherein a metal-containing precursor solution for the sol-gel process comprises less than 6 molar equivalent of at least one member selected from the group of organic additives consisting of diethanol amine, diisopropanol amine, triethanol amine, and diethylene glycol.

12. A single crystal quartz thin film according to claim 1, wherein the metal-containing precursor solution for the sol-gel process comprises at least one member selected from the group consisting of $Si(OCH_3)_4$, $Si(OC_2H_5)_4$, $Si(OC_3H_7)_4$, $Ge(OCH_3)_4$, $Ge(OC_2H_5)_4$, $Ge(OC_3H_7)_4$, $Si(COCH_2COCH_3)_4$ and $SiCl_4$.

13. A single crystal quartz thin film according to claim 1, wherein the metal-containing precursor solution comprises at least 50% by mole of silicon based on a total amount of metal elements in the precursor solution.

14. A single crystal quartz thin film according to claim 13, wherein the metal-containing precursor solution comprises at least 90% by mole of silicon based on a total amount of metal elements in the precursor solution.

15. A single crystal quartz thin film according to claim 3, wherein the germanium dioxide single crystal film, further comprises at least one alkaline metal selected from the group consisting of Li, Na and K.

16. A single crystal quartz thin film according to claim 3, wherein the germanium dioxide single crystal film comprises $3 \times 10^{-4}$ % by mole to 5% by mole of lithium, based on a total amount of metal elements in the metal-containing precursor solution for the sol-gel process.

17. A single crystal quartz thin film according to claim 16, wherein the germanium dioxide single crystal film comprises 0.03 to 3.0% by mole of lithium, based on a total amount of metal elements in the metal-containing precursor solution for the sol-gel process.

* * * * *